(12) United States Patent
Cheah et al.

(10) Patent No.: US 8,194,887 B2
(45) Date of Patent: Jun. 5, 2012

(54) SYSTEM AND METHOD FOR DYNAMIC BASS FREQUENCY CONTROL IN ASSOCIATION WITH A DYNAMIC LOW FREQUENCY CONTROL CIRCUIT HAVING COMPRESSION CONTROL

(75) Inventors: Chee Sin Cheah, Singapore (SG); Huoy Ru Rachel Koh, Singapore (SG); Thean Kuie Christopher Chang, Singapore (SG); Cunsheng Vincent Dong, Singapore (SG)

(73) Assignee: Creative Technology Ltd., Singapore (SG)

( * ) Notice: Subject to any disclaimer, the term of this patent is extended or adjusted under 35 U.S.C. 154(b) by 812 days.

(21) Appl. No.: 12/342,754

(22) Filed: Dec. 23, 2008

(65) Prior Publication Data

US 2010/0158273 A1    Jun. 24, 2010

(51) Int. Cl.
*H03G 9/00* (2006.01)

(52) U.S. Cl. ............ 381/102; 381/56; 381/98; 381/101; 381/103; 381/104; 381/107

(58) Field of Classification Search .................... 381/56, 381/98, 101, 102, 103, 104, 107
See application file for complete search history.

(56) References Cited

U.S. PATENT DOCUMENTS

| | | | | |
|---|---|---|---|---|
| 4,490,843 A | * | 12/1984 | Bose et al. | 381/102 |
| 4,837,832 A | * | 6/1989 | Fanshel | 381/317 |
| 5,410,621 A | * | 4/1995 | Hyatt | 382/260 |
| 6,566,960 B1 | * | 5/2003 | Carver | 330/297 |
| 6,718,039 B1 | * | 4/2004 | Klayman et al. | 381/1 |
| 7,016,509 B1 | * | 3/2006 | Bharitkar et al. | 381/98 |
| 8,054,993 B1 | * | 11/2011 | Kreifeldt et al. | 381/101 |
| 2003/0115454 A1 | | 6/2003 | Piikivi et al. | |
| 2003/0120940 A1 | | 6/2003 | Vataja | |
| 2006/0251275 A1 | * | 11/2006 | Ackley | 381/118 |

FOREIGN PATENT DOCUMENTS

WO    2006064171 A1    6/2006

* cited by examiner

*Primary Examiner* — Thanh V Pham
(74) *Attorney, Agent, or Firm* — Creative Technology Ltd.

(57) ABSTRACT

A system and method for dynamic bass frequency control, the system comprising: a bandwidth filter coupled to a plurality of switchable electronic components for filtering a frequency range of an input signal; an amplifier coupled to the bandwidth filter and the plurality of switchable electronic components, the amplifier being configured for adjusting amplitude of the filtered frequency range of the input signal based on a configuration of the plurality of switchable electronic components; and a signal level detector coupled to the switchable electronic components for determining signal strength of the input signal, the signal level detector being configured to switch the plurality of switchable electronic components between more than one configuration based on the signal strength of the input signal, each configuration determining the frequency range of the input signal to be filtered by the bandwidth filter and the amplitude adjustment to be made to the filtered frequency range of the input signal by the amplifier.

13 Claims, 7 Drawing Sheets

FLETCHER-MUNSON CURVES ( PRIOR ART )

SYSTEM AND METHOD FOR DYNAMIC BASS FREQUENCY CONTROL IN ASSOCIATION WITH A DYNAMIC LOW FREQUENCY CONTROL CIRCUIT HAVING COMPRESSION CONTROL

FIELD OF INVENTION

The present invention relates to a system and method for dynamic bass frequency control.

BACKGROUND

Fletcher-Munson curves, as shown in FIG. 1, are indicative of the natural inclination of an average person to perceive constant loudness when presented with pure steady tones at various audible frequencies. Based on the curves, an average user would perceive a low frequency note having the same signal strength as a note in high frequency to be softer than the latter. As such, in order to compensate for this irregularity in human hearing within the audible range, it is necessary to boost the output signal in the low frequency region.

Numerous solutions have been proposed to compensate for the irregularity in human hearing. Most of the solutions are Digital Signal Processor (DSP) based. There are also less costly Analogue based solutions. However, Analogue based solutions commonly have difficulties in delivering the desired multiple loudness compensation curves and in controlling the gain and centre frequency of the signal.

A need therefore exists to provide a system and method for dynamic bass frequency control that addresses at least one of the above-mentioned problems.

SUMMARY

In accordance with one aspect of the present invention, there is provided a system for dynamic bass frequency control, the system comprising: a bandwidth filter coupled to a plurality of switchable electronic components for filtering a frequency range of an input signal; an amplifier coupled to the bandwidth filter and the plurality of switchable electronic components, the amplifier being configured for adjusting amplitude of the filtered frequency range of the input signal based on a configuration of the plurality of switchable electronic components; and a signal level detector coupled to the switchable electronic components for determining signal strength of the input signal, the signal level detector being configured to switch the plurality of switchable electronic components between more than one configuration based on the signal strength of the input signal, each configuration determining the frequency range of the input signal to be filtered by the bandwidth filter and the amplitude adjustment to be made to the filtered frequency range of the input signal by the amplifier.

The system may further comprise a zero crossing detector coupled to the signal level detector for determining zero crossing points in the input signal and generating a zero crossing signal upon determining a zero crossing point, the signal level detector being configured to send a switching signal to switch the switchable electronic components between the more than one configuration based on the zero crossing signal.

The system may further comprise a buffer device coupled to the zero crossing detector and the signal level detector, the buffer device being configured to store the switching signal and forward the stored switching signal to the switchable electronic components to switch the switchable electronic components between the more than one configuration upon receiving the zero crossing signal from the zero crossing detector.

The amplifier may be part of the bandwidth filter.

The plurality of switchable electronic components may comprise two or more separate capacitor banks. The banks may comprise switches for connecting up one or more capacitors to form a configuration.

At least one of the capacitor banks may have a fixed capacitance value and the capacitance value of at least one of the capacitor banks can be varied.

The signal level detector may determine that the input signal strength is above a threshold level. The plurality of switchable electronic components may be switched to a configuration that configures the bandwidth filter to filter a bass frequency range of the input signal and configures the amplifier to attenuate the amplitude of the filtered bass frequency range of the input signal.

The signal level detector may determine that the input signal strength is below a threshold level. The plurality of switchable electronic components may be switched to a configuration that configures the bandwidth filter to filter a bass frequency range of the input signal and configures the amplifier to amplify the amplitude of the filtered bass frequency range of the input signal.

The switching resolution of the plurality of switchable electronic components between different configurations may be progressively increased as the input signal is progressively increased.

In accordance with another aspect of the present invention, there is provided a method for dynamic bass frequency control, the method comprising: filtering a frequency range of an input signal; adjusting amplitude of the filtered frequency range of the input signal; determining signal strength of the input signal; switching a plurality of switchable electronic components between more than one configuration based on the signal strength of the input signal; and determining based on the configuration the frequency range of the input signal to filter and the amplitude adjustment to be made to the filtered frequency range of the input signal.

The method may further comprise determining a zero crossing point in the input signal, generating a zero crossing signal upon determining a zero crossing point, and switching the plurality of switchable electronic components between the more than one configuration based on the zero crossing signal.

The method may further comprise storing a switching signal to switch the switchable electronic components between the more than one configuration, and forwarding the stored switching signal to switch the switchable electronic components between the more than one configuration on receiving the zero crossing signal.

The method may further comprise switching the plurality of switchable electronic components to a configuration that causes the filtering of a bass frequency range of the input signal and attenuation of the amplitude of the filtered bass frequency range of the input signal if the input signal strength is determined to be above a threshold level.

The method may further comprise switching the plurality of switchable electronic components to a configuration that causes the filtering of a bass frequency range of the input signal and amplification of the amplitude of the filtered bass frequency range of the input signal if the input signal strength is determined to be below a threshold level.

BRIEF DESCRIPTION OF THE DRAWINGS

Embodiments of the invention would be better understood and readily apparent to one of ordinary skill in the art from the following written description, by way of example only and in conjunction with the drawings, in which.

DETAILED DESCRIPTION

Figure 1:
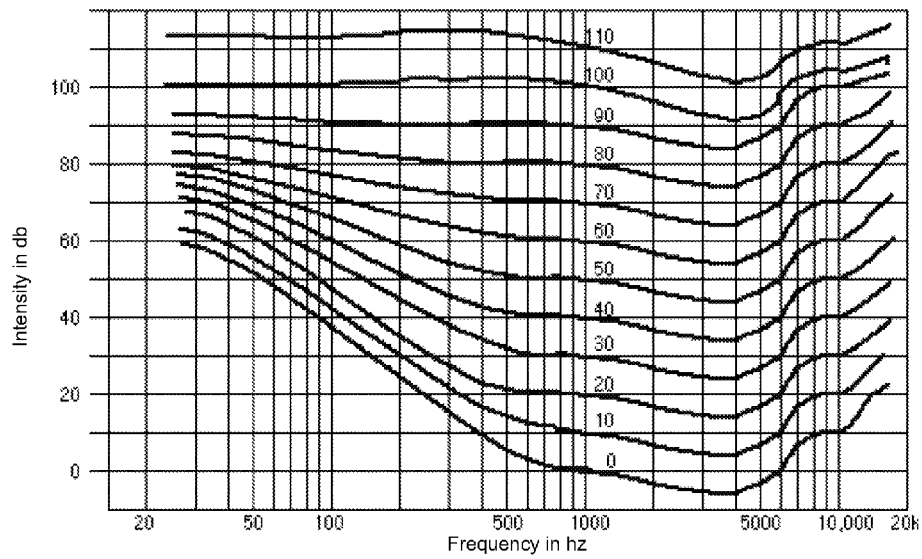
FIG. 1 shows Fletcher-Munson curves.
Figure 2:
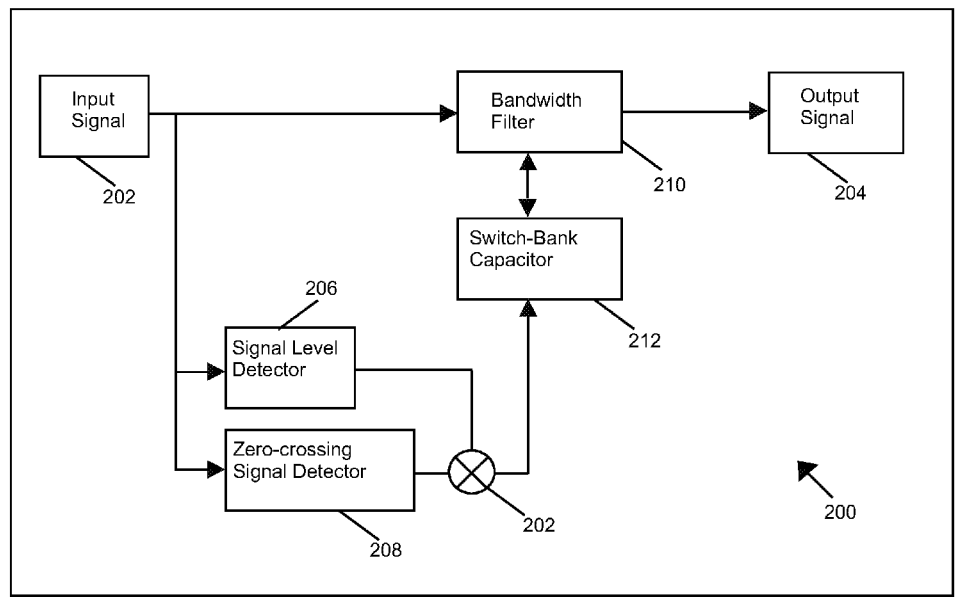
FIG. 2 shows a schematic drawing of a dynamic low frequency control circuit according to an example embodiment of the present invention.

An example embodiment of the present invention is illustrated in FIG. 2. There is provided a system for dynamic bass frequency control in the form of a dynamic low frequency control circuit 200 having compression control. The circuit 200 is used generally for dynamic loudness compensation. It comprises a feed-forward control topology for dynamically adjusting the low frequency range of an input signal 202 based on the input signal level detected. During low input signal level, low frequency components of the input signal 202 would be boosted, while during high input signal level, low frequency components of the input signal 202 would be maintained or compressed. In this manner, loudness compensation is achieved to counter the effects of irregularity in human hearing, which is derived based on the Fletcher-Munson Curves shown in FIG. 1. Additionally, the circuit 200 also limits distortion of extremely high input signal level in the low frequency range.

In the example embodiment, the circuit 200 includes a signal level detector 206, a zero crossing detector 208, a buffer device 214 with trigger detection, a bandwidth filter 210 and a plurality of switchable electronic components 212. Generally, the function of the circuit 200 is to receive input signal 202 and adjust the input signal 202 automatically using its components to produce a desired output signal 204. For illustration purposes, the input signal 202 and output signal 204 in the example embodiment are electrical audio signals.

The plurality of switchable electronic components may include resistors, inductors, capacitors, or a mix of resistors, capacitors and/or inductors that are connected up and switchable between various configurations for adjusting a bandwidth filter 210 and an amplifier (incorporated as part of the bandwidth filter 210 in the example embodiment and not shown in FIG. 2) to achieve dynamic loudness compensation. The capacitors, inductors and/or resistors could be placed in parallel and/or in series connection with one another, along with switches located at appropriate locations, to obtain various switchable configurations. The various configurations cause the circuitry of the bandwidth filter 210 and the amplifier to change and compensate loudness according to the changes.

The signal level detector 206 is used firstly to retrieve the RMS (root mean square) voltage of the input signal 202, which is representative of the signal strength of the input signal 202. Next, the signal level detector 206 compares the root mean square voltage with a threshold voltage. If the signal strength of the input signal 202 is beyond the threshold voltage. The signal level detector will generate a switching signal to be sent to the switchable electronic components 212.

The zero crossing detector 208 receives the input signal 202 to determine instances where the input signal 202 crosses zero voltage. At those instances, the zero crossing detector 208 would generate a zero crossing signal. The switching of the switchable electronic components 212 is enabled only when the input signal 202 crosses zero voltage.

The buffer device 214 buffers signals from the signal level detector 206 and sends the buffered signals on a first in first out basis to the plurality of switchable electronic components 212 upon receiving a zero crossing signal (i.e. a triggering signal) from the zero crossing detector 208.

The bandwidth filter 210 receives the input signal 202 and provides the necessary signal level boost (i.e. amplifies) or compression, and widening or reduction of a filtered frequency range of the input signal 202. As described earlier, the bandwidth filter 210 of the example embodiment includes an amplifier (e.g. 316 in FIG. 3; not shown in FIG. 2). The amplifier is part of the bandwidth filter 210 and is used for performing the signal level boost or compression. The bandwidth filter 210 is operatively connected to the switchable electronic components 212 and the frequency response of the bandwidth filter 210 is adjustable by changing the configuration of the switchable electronic components of the switchable electronic components 212.

For illustration purposes, in the example embodiment, the plurality of switchable electronic components 212 refers to multiple capacitors in parallel connection. The switchable electronic components 212 are switchable between various capacitor configurations to provide different capacitance values. The plurality of switchable electronic components may include two or more separate capacitor banks (e.g. 302 and 304 in FIG. 3) where the banks include switches for connecting up one or more capacitors to form a capacitor configuration.

In the example embodiment, during operation, the input signal 202 is fed to the bandwidth filter 210, the signal level detector 206 and the zero crossing detector 208. The signal level detector 206 and the zero crossing detector 208 operate together with the buffer device 214 to switch the configuration of the switchable electronic components 212 according to current input signal strength. Each configuration may be associated with, for instance, a specific capacitance value (e.g. in the case of 1 capacitor bank) or a specific set of capacitance values (e.g. in the case of 2 or more capacitor banks where each bank may have different capacitance values). The number of switches to close or open in the switchable electronic components 212 to achieve a particular capacitance value is determined by the root mean square voltage of the input signal 202. After the signal level detector 206 analyses the input signal 202, switching signals are sent to the buffer device 214, which will forward the switching signals to the switchable electronic components 212 to change configuration upon receiving a zero crossing signal from the zero crossing detector 208. In the example embodiment, to prevent distortion to the output signal 204, the switches are opened or closed only at the zero crossing points in the input signal 202, which are detected by the zero crossing detector 208. If the switches are allowed to be triggered or toggled beyond zero crossing points in the input signal 202, the resulting distortions may be heard as abrupt jumps in the sound output. In the example embodiment, each configuration determines the frequency range of the input signal to be filtered by the bandwidth filter 210 and the amplitude adjustment to be made to the filtered frequency range of the input signal 202 by the amplifier, which is part of the bandwidth filter 210. By adjusting the configuration of the switchable electronic components, output signals 204 with different characteristics in terms of the gain and the centre frequency could be produced.

In the example embodiment, the input signal 202 is adjusted by tuning the bandwidth filter 210, i.e. changing the configuration of the switchable electronic components to a configuration such that the amplitude of the low frequency range of the input signal 202 is increased, maintained or reduced to compensate for the effects of the irregularity in human hearing, which is illustrated in the Fletcher-Munson Curves shown in FIG. 1. For input signal 202 with low signal strength i.e. low amplitude, the bandwidth filter 210 is adjusted to provide signal boost for the low frequency range of the input signal 202. For input signal with high signal strength i.e. high amplitude not exceeding the supported range of signal levels of the circuit 200, the input signal strength is maintained and the bandwidth filter 210 would not be adjusted to boost the low frequency range. For input signal 202 with extremely high signal strength exceeding the supported range of signal levels of the circuit 200, the low frequency range of the input signal 202 has to be controlled such that the output signal 204 does not suffer from undue distortion due to clipping of the audio signal as its signal strength goes beyond the supported range of signal levels of the circuit 200. To limit distortion arising from clipping, the bandwidth filter 210 is adjusted to reduce the signal strength of the low frequency range of the input signal 202 to a level not exceeding the supported range of signal levels of the circuit 200.

A feed-forward control topology is used in the circuit 200 of the example embodiment as it has several advantages. A feed-forward control topology reacts to signal changes and alters the output signal 204 much faster than a feedback topology. Hence, to an average user, he or she would find the transition between soft sounds (where low frequency range of the input signal 202 is boosted by the circuit 200) and loud sounds (where distortion due to clipping in the low frequency range of the input signal 202 is limited by the circuit 200), to be smoother and less glaring.

It is appreciated that the circuit 200 of the example embodiment can be incorporated in a multimedia speaker system to obtain dynamic bass boost and compression control of the audio signal as the input signal level changes. During low input signal level, loudness compensation is introduced, such that the low frequency components are boosted. During high input signal level, loudness compensation would be halted, such that the low frequency components are not expanded or boosted. However, during extremely high input signal level, the low frequency components are compressed to prevent clipping of signal. It is noted that low frequency audible clipping would result in unpleasant listening.

Figure 3:
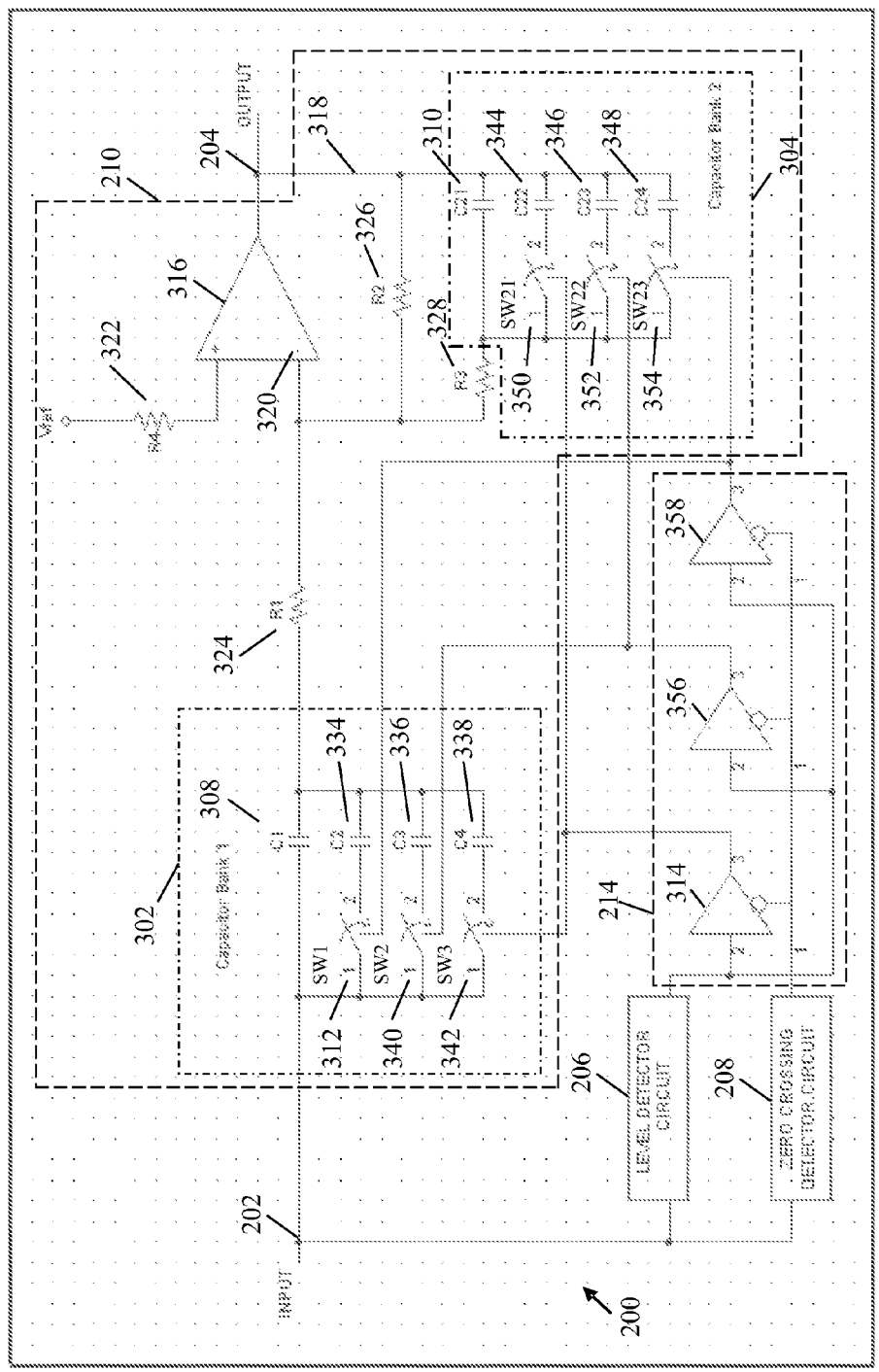
FIG. 3 shows a schematic drawing of a dynamic low frequency control circuit according to an example embodiment of the present invention.

FIG. 3 shows a non-limiting example of a specific implementation of the dynamic low frequency control circuit 200 described earlier with reference to FIG. 2.

The bandwidth filter 210 is constructed based on a first order operational amplifier bandpass filter circuit 306. The switchable electronic components 212 comprise two capacitor banks 302 and 304. The first capacitor bank 302 is connected adjacent to the source of the input signal, $V_i$, 202. The second capacitor bank 304 is connected along the feedback loop 318 of an operational amplifier 316 linking the output point having the output signal, $V_o$, 204 to the inverting input 320 of the operational amplifier 316. The operational amplifier 316 provides a gain, G, which is dependent on the capacitance values of the switchable electronic components 212.

The first capacitor bank 302 has four capacitors, C1 308, C2 334, C3 336 and C4 338. C1 308 is the default capacitance of the first capacitor bank. C2 334, C3 336 and C4 338 are in series connection with three switches, SW1 312, SW2 340 and SW3 342 respectively. The individual series connections of C2 334 and SW1 312, C3 336 and SW2 340, and C4 338 and SW3 342 respectively are in parallel connection with one another and with C1 308.

The second capacitor bank 304 has four capacitors, C21 310, C22 344, C23 346, and C24 348. C21 310 is the default capacitance of the first capacitor bank. C22 344, C23 346 and C24 348 are in series connection with three switches, SW21 350, SW22 352 and SW23 354 respectively. The individual series connections of C22 344 and SW21 350, C23 346 and SW22 352, and C24 348 and SW23 354 respectively are in parallel connection with one another and with C21 310.

Four resistors 322, 324, 326 and 328 are connected to the operational amplifier 316 and the capacitor banks 302 and 304. The first resistor, R1, 324 is connected between the inverting input 320 and the first capacitor bank 302. The second resistor, R2, 326 is connected along the feedback loop 318 and is in parallel connection with a series connection comprising of the third resistor, R3, 328 and the second capacitor bank 304. The fourth resistor, R4, 322 is connected between a reference voltage source 330 and the non-inverting input 332 of the operational amplifier 316.

The equations governing the operation of the bandwidth filter 210 shown in FIG. 3 are as follow:

The capacitances of C1 308, C2 334, C3 336, C4 338, C21 310, C22 344, C23 346, and C24 348 are represented by C1, C2, C3, C4, C22, C23 and C24 respectively in the equations. The resistance of R1 322, R2 324, R3 326 and R4 328 are represented by R1, R2, R3 and R4 respectively in the equations.

$$G = \frac{Z_1}{Z_2}$$

where $$Z_1 = \frac{R2(1 + w_c C_2 R3)}{1 + w_c C_2 R2 + w_c C_2 R3}$$

$$Z_2 = \frac{1 + w_c C_1 R1}{w_c C_1}$$

where, total second capacitor bank capacitance, $$C_2 = C21 + \sum_{i=2}^{4} nC2i,$$

the value of n being 1 if the corresponding switch is closed and 0 if the corresponding switch is opened.

where, total first capacitor bank capacitance, $$C_1 = C1 + \sum_{i=2}^{4} nCi,$$

the value of n being 1 if the corresponding switch is closed and 0 if the corresponding switch is opened.

$$f_c = \frac{w_c}{2\pi}$$

where, $f_c$ is the centre frequency of the boosted signal in the low frequency component. In the example embodiment, $f_c$ is selected to be in the range of 80 Hz-100 Hz.

In FIG. 3, the buffer device 214 coupled to the signal level detector 206 and zero crossing detector 208 has three buffers with triggering edge detectors 314, 356 and 358. The buffer device 214 receives signals from both the signal level detector 206 and the zero crossing detector 208. The signals from the signal level detector 206 direct the switching, i.e. opening or closing of the switches in the first and second capacitor banks 302 and 304, whereas the signals from the zero crossing detector 208 determine when to switch the switches. The buffer device 214 buffers or stores switching signals from the signal level detector 206 in buffers 314, 356 and 358. The buffer device 214 waits for the receipt of a pulse signal from the zero crossing circuit 208 and forwards the switching signals to the first and second capacitor banks 302 and 304 to change the configuration of the first and/or second capacitor banks 302 and 304 on detecting the triggering edge of the pulse signal.

It is appreciated that higher orders of bandpass filter circuits could be used in other example embodiments to achieve better filtering and signal amplification results. In a similar manner as the example embodiments herein described, switchable capacitor banks could be coupled to the higher order bandpass filter circuit for adjusting the filtering and/or amplitude adjustment performance of the circuit.

Figure 4:
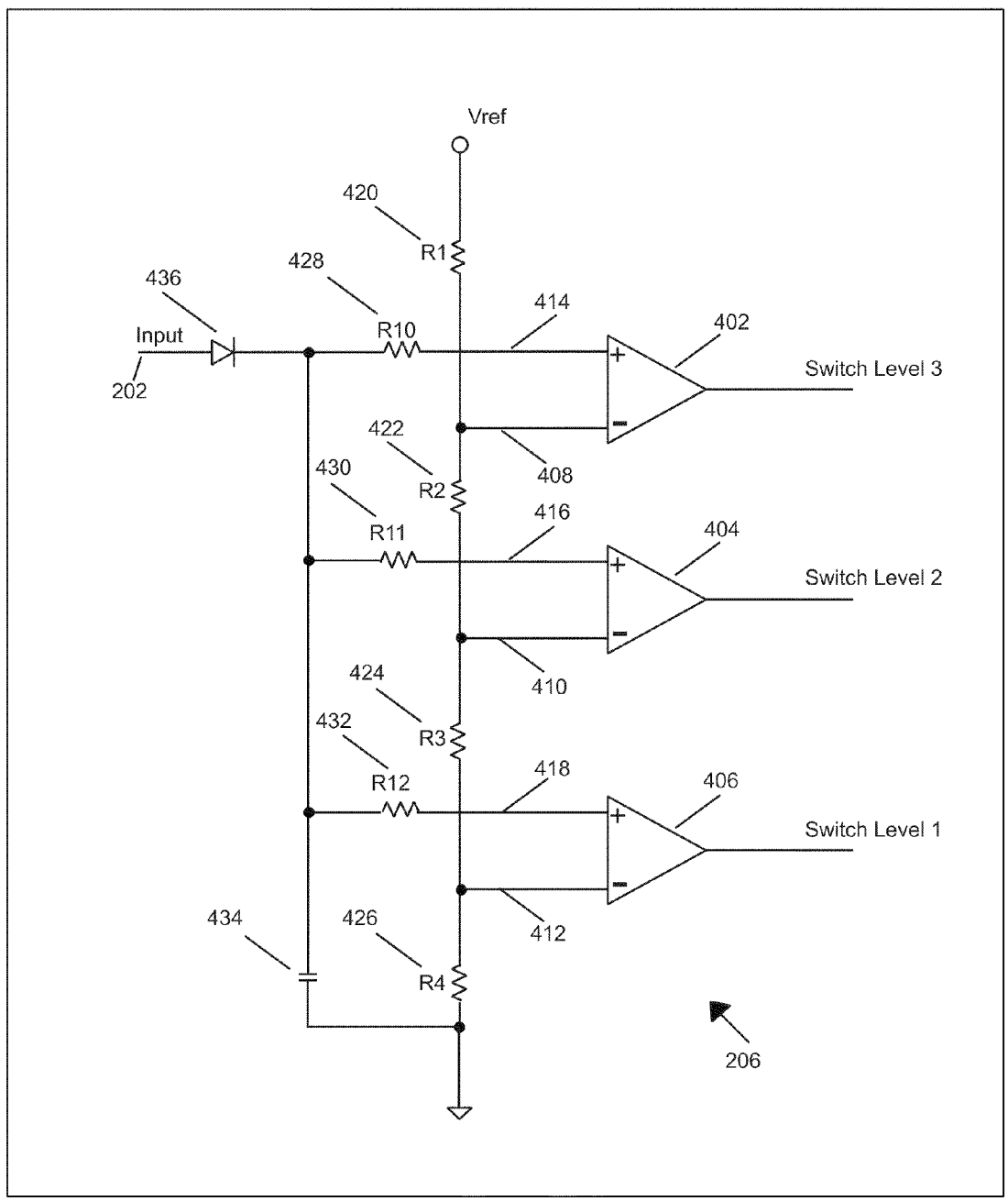
FIG. 4 shows a schematic drawing of a signal level detector according to an example embodiment of the present invention.

FIG. 4 is a non-limiting example of the signal level detector 206 shown in FIGS. 2 and 3 that is used for toggling switches SW1 312, SW2 340 and SW3 342 of the first capacitor bank 302, and switches SW21 350, SW22 352 and SW23 354 of the second capacitor bank 304.

Each of the switches SW1 312, SW2 340 and SW3 342 of the first capacitor bank 302 may be normally closed and require an electrical signal to open if analogue electronic switches are used, or require overcoming a biasing force, from a spring, magnetic force, or other biasing means, to open if electromechanical switches are used. On the other hand, the switches SW21 350, SW22 352 and SW23 354 of the second capacitor bank 304 may be normally opened and require an electrical signal to close if analogue electronic switches are used, or require overcoming a biasing force, from a spring, magnetic force, or other biasing means, to close if electromechanical switches are used. In the example embodiment, all the switches SW1 312, SW2 340, SW3 342, SW21 350, SW22 352 and SW23 354 are analogue electronic switches, which can be switched on or off through an applied electrical voltage.

With reference to FIG. 4, there are provided a first, a second and a third operational amplifier 402, 404 and 406 respectively. Each of these amplifiers 402, 404 and 406 is used as a voltage comparator. The inverting inputs 408, 410 and 412 of the operational amplifiers 402, 404 and 406 are each held at three threshold levels with voltage values, $V_3$, $V_2$ and $V_1$ respectively. A reference Voltage, $V_{ref}$, is proportioned by a series connection of four resistors, R1 420, R2 422, R3 424 and R4 426 so as to provide the threshold voltages $V_3$, $V_2$ and $V_1$. R1 420 is connected adjacent to the reference Voltage source, $V_{ref}$. R2 422 is connected adjacent to R1 420 and R3 424 is connected adjacent to R2 422. R4 426 is connected adjacent to R3 424. Finally, R4 426 is connected to ground. The threshold voltage, $V_3$, is available between R1 420 and R2 422, $V_2$ is available between R2 422 and R3 424, and $V_1$ is available between R3 424 and R4 426. The values of the threshold voltages are in the relationship, $V_3 > V_2 > V_1$. Hence, $V_3$ is for detecting high input signal level, $V_2$ is for detecting medium input signal level and $V_1$ is for detecting low input signal level. The outputs of each amplifier 402, 404 and 406 would be HIGH when the input signal 202 reaches their individual threshold voltages, otherwise the outputs would be LOW.

The outputs of the amplifiers 402, 404 and 406 control the opening of specific switches in the first capacitor bank 302, which are normally closed, and the closing of specific switches in the second capacitor bank 304, which are normally opened. The output of amplifier 402 is coupled to buffer 314 in FIG. 3 and it is the switching signal for controlling switches, SW3 342 and SW21 350. The output of amplifier 404 is coupled to buffer 356 in FIG. 3 and it is the switching signal for controlling switches SW2 340 and SW22 352. The output of amplifier 406 is coupled to buffer 358 in FIG. 3 and it is the switching signal for controlling SW1 312 and SW23 354. It is noted that the switches are only triggered by switching signals stored at the buffers 314, 356 and 358. The stored switching signals are forwarded to the switches at the time when the buffer device (214 in FIGS. 2 and 3) detects the triggering edge of a pulse signal generated by the zero crossing detector (208 in FIGS. 2, 3 and 5).

The non-inverting inputs 414, 416 and 418 of the operational amplifiers 402, 404 and 406 respectively are connected to resistors R10 428, R11 430 and R12 432 respectively at one end. The other end of the resistors R10 428, R11 430 and R12 432 is connected to an output end of a rectifier diode 436. The input end (i.e. p-type material end) of the rectifier diode 436 (i.e. a p-n junction diode) is connected to receive the input signal 202 from its source (not shown in the figures). A capacitor, C41 434, is connected between the output end (i.e. n-type material end) of the rectifier diode 436 and ground. The rectifier diode 436 and the capacitor C41 434 are utilised in the rectification of the alternating input signal 202 to provide a Direct Current (DC) signal with a root mean square voltage, $V_{rms}$, to the non-inverting inputs 414, 416 and 418. The DC signal received at the non-inverting inputs 414, 416, and 418 is then compared with the three threshold values to determine its signal level.

With reference to FIGS. 3 and 4, if $V_{rms}$ is in a very low voltage range, i.e. $0 \leq V_{rms} \leq V_1$, none of the amplifiers 402, 406 and 408 would produce any output and none of the switches will be toggled. Hence, the switches will remain in its normal configuration, that is, SW1 312, SW2 340 and SW3 342 would be closed, and SW21 350, SW22 352 and SW23 354 would be opened. In this case, the capacitance value of the first capacitor bank 302 is equal to the capacitance value of C1 308+C2 334+C3 336+C4 338 and the capacitance value of the second capacitor bank 304 is equal to the capacitance value of C21 310.

If $V_{rms}$ is in a low voltage range, i.e. $V_1 \leq V_{rms} \leq V_2$, the third operational amplifier 406 would output a switching signal to open SW3 342 and close SW21 350. In this case, the capacitance value of the first capacitor bank 302 is equal to the capacitance value of C1 308+C2 334+C3 336 and the capacitance value of the second capacitor bank 304 is the capacitance of C21 310+C22 344.

If $V_{rms}$ is in a medium voltage range, i.e. $V_2 \leq V_{rms} \leq V_3$, the second operational amplifier 404 would output a switching signal to open SW2 340 and close SW22 352. In this case, the capacitance value of the first capacitor bank 302 is equal to the capacitance value of C1 308+C2 334 and the capacitance value of the second capacitor bank 304 is the capacitance of C21 310+C22 344+C23 346.

If $V_{rms}$ is in a high voltage range i.e. $V_3 \leq V_{rms} \leq V_{ref}$, the first operational amplifier 402 would output a switching signal to open SW1 312 and close SW23 354. In this case, the capacitance value of the first capacitor bank 302 is equal to the capacitance value of C1 308 and the capacitance value of the second capacitor bank 304 is the capacitance of C21 310+C22 344+C23 346+C24 348.

It is appreciated that each one of the analogue electronic switches SW1 312, SW2 340, SW3 342, SW21 350, SW22 352 and SW23 354 described with reference to FIGS. 3 and 4 could be for instance, an electronic component that behaves in a similar way to a relay switch but has no moving parts. The switching element could be a MOSFET. The control input to the analogue electronic switch could be a CMOS or TTL logic input, which is shifted by internal circuitry to a suitable voltage for switching the MOSFET. The result is that logic 0 on the control input would cause the MOSFET to have a high resistance, so that the switch is off, and logic 1 on the control input causes the MOSFET to have a low resistance, so that the switch is on.

Figure 5:
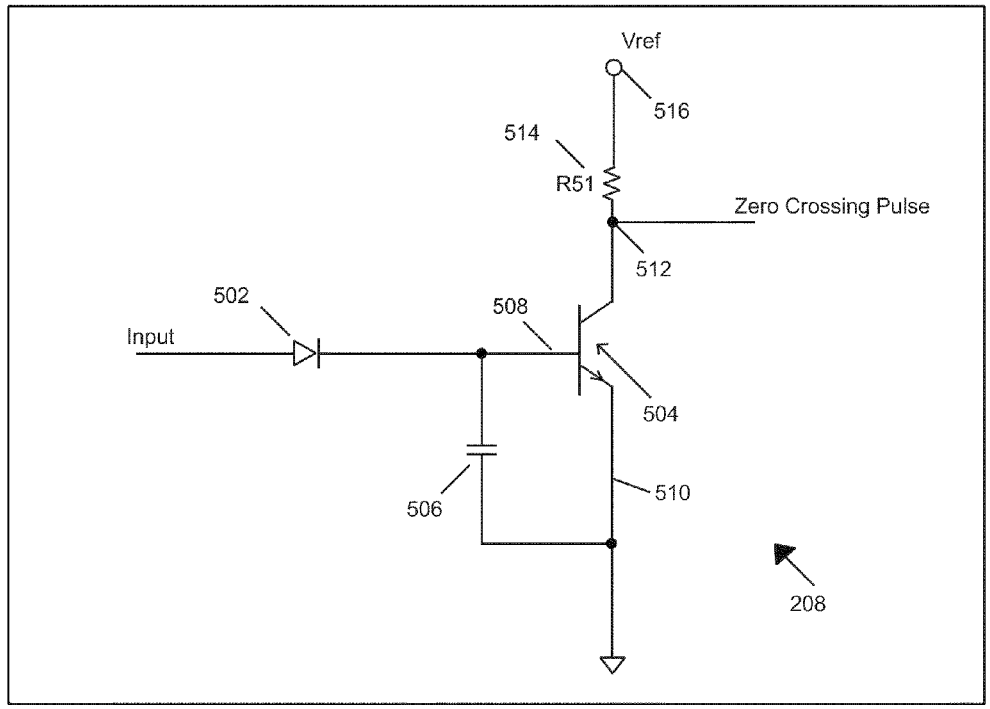
FIG. 5 shows a schematic drawing of a zero crossing detector according to an example embodiment of the present invention.

FIG. 5 shows a non-limiting example of an implementation of the zero crossing detector 208. The zero crossing detector 208 is a device for detecting the instant where an input signal voltage crosses zero voltage and generates a zero crossing pulse, i.e. a square wave or pulse of short time duration, at that instant.

With reference to FIG. 5, there is provided in the zero crossing detector 208 a diode 502 (i.e. a p-n junction diode) arranged to receive the input signal 202 described with reference to FIG. 2 at its input end (i.e. p-type material end). Located downstream of the diode 502 is an NPN transistor 504 having a base terminal 508, an emitter terminal 510 and a carrier terminal 512. The emitter terminal 510 is grounded. A capacitor, C51 506, is connected across the base terminal 508 and the emitter terminal 510 of the NPN transistor 504. The carrier terminal 512 is connected to one end of a resistor, R51 514. The other end of the resistor R51 514 is connected to a reference voltage point 516 with voltage, $V_{ref}$. The output point of the zero crossing detector 208, which provides the output voltage and emits the zero crossing pulse, is at the carrier terminal 512.

The capacitor, C51 506, charges up to a voltage level, $V_c$, on receiving the input signal 202 through the diode 502 and is used to minimize ripples when providing a Direct Current (DC) signal to the base terminal 508 of the NPN transistor 504. The NPN transistor 504 remains OFF until a Cut-in voltage $V_{BE}$ between the Base terminal 508 and the emitter terminal 510, is reached. During the OFF period of the NPN transistor 504, the output voltage at the carrier terminal 512 will be high and approximately equal to the voltage at the reference voltage point 516, $V_{ref}$. Once the NPN transistor 504 is ON and the base current of the NPN transistor 504, $I_B$, starts to flow, the NPN transistor 504 moves towards saturation where the output at the carrier terminal 512 reduces to the saturation voltage of the NPN transistor 504, which is nearly equal to zero.

$V_{BE}$ is set to be equal to the cut-in or ON voltage of the diode 502. The capacitor, C51 506, will charge through the diode 502 at approximately $V_m$, where $V_m$ is the maximum amplitude of the DC signal generated to the base terminal 508.

At the instance where the input signal 202 produces a voltage difference across the diode 502 that is higher than or equal to the cut-in or ON voltage of the diode 502, the base current $I_B$ would flow and the NPN transistor 504 would be turned ON. When the NPN transistor 504 is ON, the voltage at the carrier terminal 512 becomes nearly equal to zero.

At the instance where the input signal 202 has a voltage difference across the diode 502 lower than the cut-in ON voltage of the diode 502, which is close to zero, base current, $I_B$, would cease to flow. When base current, $I_B$, ceases to flow, the NPN transistor 504 switches to OFF and the voltage at the carrier terminal 512 becomes about $V_{ref}$.

Hence, an output square wave or pulse is produced at the carrier terminal 512 whenever the voltage of the input signal 202 crosses zero, thereby providing the effect of a zero crossing detector.

Figure 6:
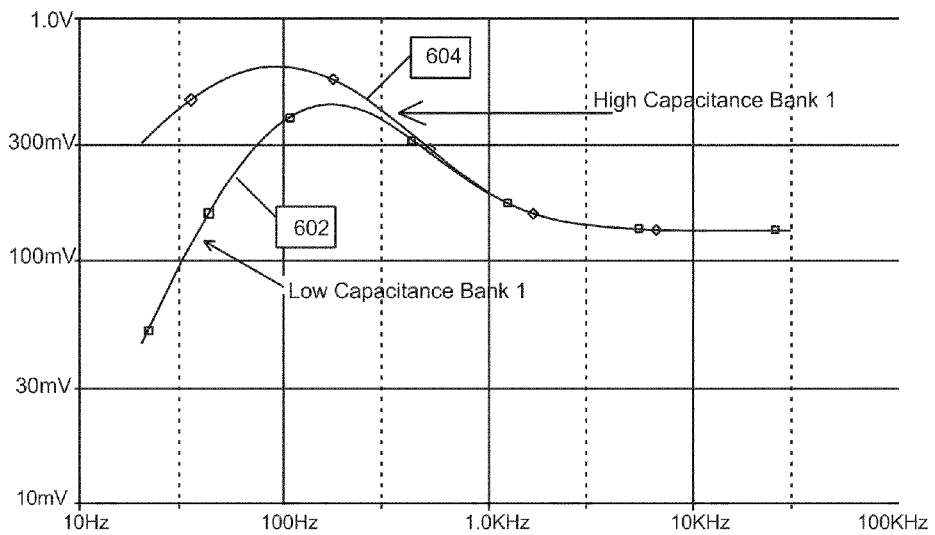
FIG. 6 shows frequency response curves of an example embodiment of the present invention.

FIG. 6 shows the frequency response of the dynamic low frequency control circuit 200 described with reference to FIGS. 2 and 3 when the capacitance of the second capacitor bank 304 is fixed at one value and the capacitance of the first capacitor bank 302 is varied.

When the capacitance of the first capacitor bank 302 is of lower value, the dynamic low frequency control circuit 200 produces an output having frequency response, as illustrated by curve 602, which provides lesser or no gain to the filtered range of frequencies in the low audible frequency range. Decreasing the capacitance of the first capacitor bank 302 would result in bass signal attenuation in the low audible frequency range and the centre frequency, $f_c$ will shift towards the higher frequency range.

When the capacitance of the first capacitor bank 302 is increased and is of a higher capacitance value, the dynamic low frequency control circuit 200 produces an output having frequency response, as illustrated by curve 604, which has an increase in gain to the filtered range of frequencies in the lower audible frequency range. Increasing the capacitance of the first capacitor bank 302 would result in bass boost or increased bass boost in the low audible frequency range and the centre frequency, $f_c$ will shift towards the lower frequency range.

In FIG. 6, the High capacitance frequency response curve 604 appears to shift upwards and spreads wider to the left of the Low capacitance frequency response curve 602, therefore indicating a lower centre frequency in the low audible frequency range. The High capacitance frequency response curve 604 also appears further away from the frequency axis, indicating an increase in the gain of the filtered range of frequencies of the output signal of the dynamic low frequency control circuit 200.

Figure 7:
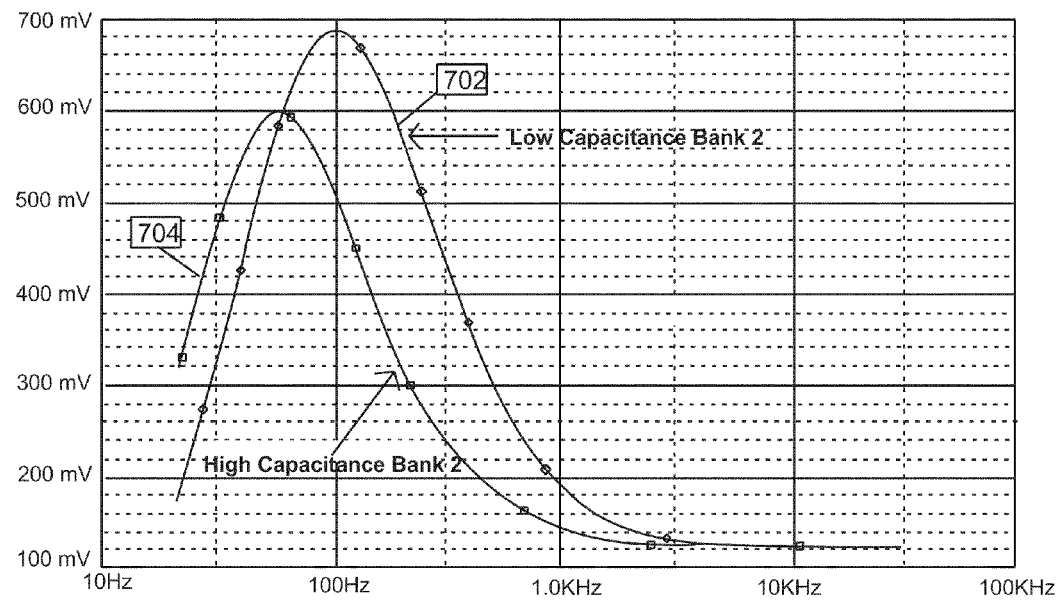
FIG. 7 shows frequency response curves of an example embodiment of the present invention.

FIG. 7 shows the frequency response of the dynamic low frequency control circuit 200 described with reference to FIGS. 2 and 3 when the capacitance of the first capacitor bank 302 is fixed at one value and the capacitance of the second capacitor bank 304 is varied.

When the capacitance of the second capacitor bank 304 is of lower value, the dynamic low frequency control circuit 200 produces an output having frequency response, as illustrated by curve 702, which has an increase in gain to the filtered range of frequencies for the output signal in the low audible frequency range. Decreasing the capacitance of the second capacitor bank 304 would result in bass boost or increased bass boost in the low audible frequency range and the centre frequency, $f_c$ will shift towards the higher frequency range.

When the capacitance of the second capacitor bank 304 is increased and is of a higher capacitance value, the dynamic low frequency control circuit 200 produces an output having frequency response, as illustrated by curve 704, which provides lesser gain to the filtered range of frequencies in the low audible frequency range. Increasing the capacitance of the second capacitor bank 304 would result in bass signal attenuation in the low audible frequency range and the centre frequency, $f_c$ will shift towards the lower frequency range.

In FIG. 7, the Low capacitance frequency response curve 702 appears to shift and move upwards to the right of the High capacitance frequency response curve 704, therefore indicating a higher centre frequency in the low audible frequency range. The Low capacitance frequency response curve 702 also appears further away from the frequency axis, indicating an increase in the gain of the filtered range of frequencies of the output signal of the dynamic low frequency control circuit 200.

Figure 8:
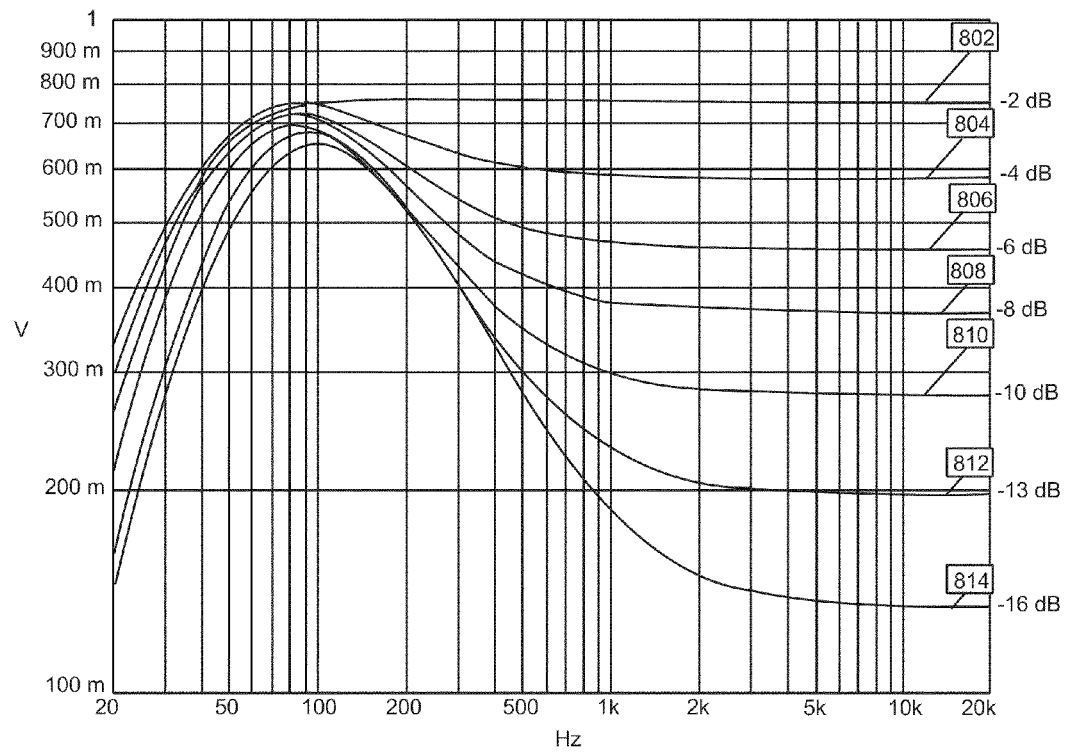
FIG. 8 shows frequency response curves of an example embodiment of the present invention.
Figure 9:
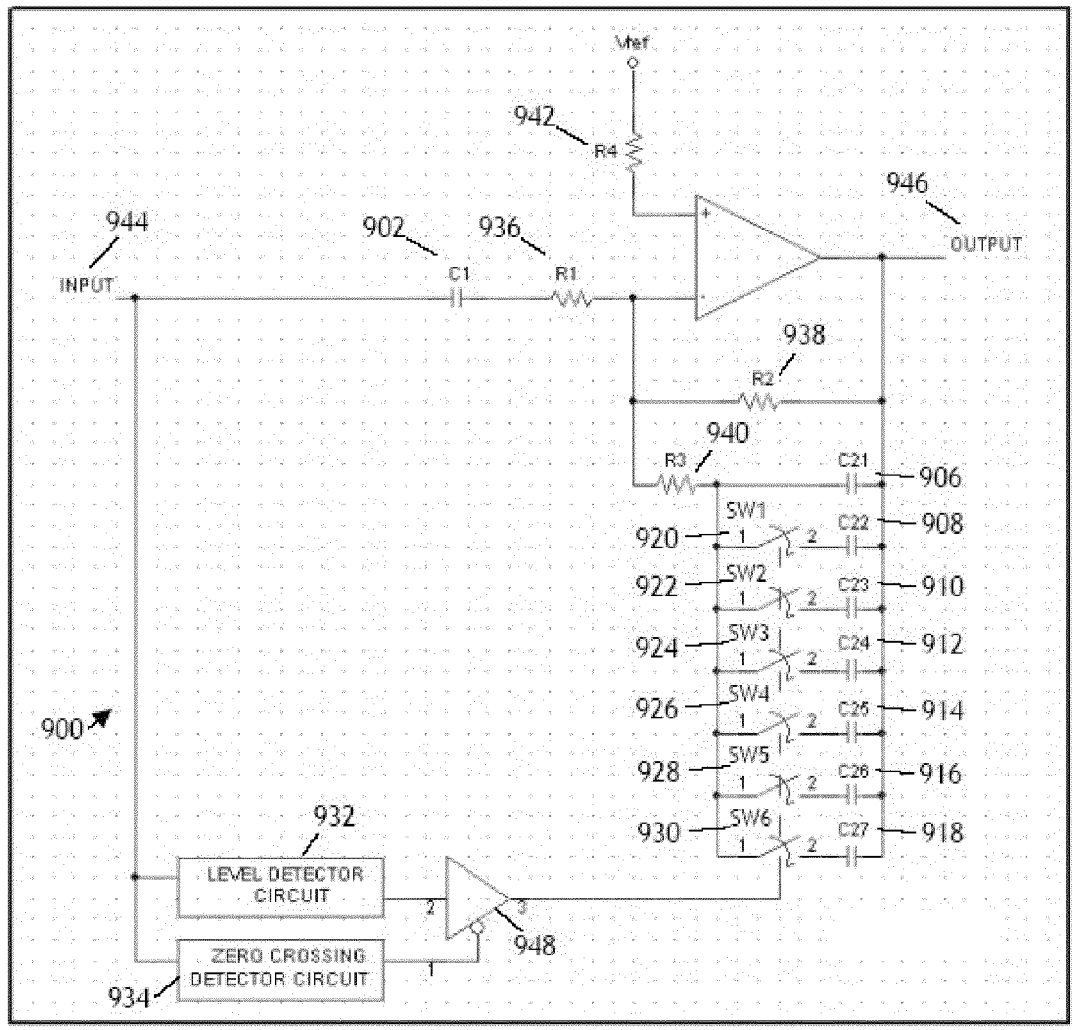
FIG. 9 shows a schematic drawing of a dynamic low frequency control circuit according to an example embodiment of the present invention.

FIGS. 8 and 9 illustrate a dynamic low frequency control circuit 900 of another example embodiment of the present invention. FIG. 8 illustrates the frequency response of a dynamic low frequency control circuit 900. The dynamic low frequency control circuit 900 is substantially similar to the dynamic low frequency control circuit 200 described with reference to FIGS. 2 and 3.

With reference to FIG. 9, the only differences between the dynamic low frequency control circuit 900 and the circuit 200 illustrated in FIGS. 2 and 3 are as follow. Firstly, the first capacitor bank 302 of the circuit 200 illustrated by FIGS. 2 and 3 is replaced by one capacitor, C1 902. Secondly, the second capacitor bank 304 of the circuit 200 illustrated by FIGS. 2 and 3 is replaced by a capacitor bank 904 having seven capacitors, C21 906, C22 908, C23 910, C24 912, C25 914, C26 916 and C27 918, connected in parallel with one another. Of the seven capacitors, six of the capacitors, i.e. C22 to C27 (908, 910, 912, 914, 916 and 918), are each connected in series with a switch, i.e. SW1 920, SW2 922, SW3 924, SW4 926, SW5 928 and SW6 930. Each of these switches is used for connecting or disconnecting the corresponding capacitor in accordance with the switching signals from a signal level detector 932 (or level detector circuit), which operates together with the connected zero crossing detector 934 (or zero crossing detector circuit) and a buffer device 948. The signal level detector 932, zero crossing detector 934 and the buffer device 948 operates in the same manner as the signal level detector 206, zero crossing detector 208 and the buffer device 214 described with reference to FIGS. 2 and 3. Hence, the dynamic low frequency control circuit 900 has six switchable resolutions and a default resolution. The component values for the dynamic low frequency control circuit 900 are shown in the table as follow. Resistors of the dynamic low frequency control circuit 900, R1 936, R2 938, R3 940 and R4 942 correspond with resistors R1 324, R2 326, R3 328 and R4 322 in the circuit 200 of FIGS. 2 and 3.

| Component | Value |
| --- | --- |
| R1 | 10K ohm |
| R2 | 100K ohm |
| R3 | 10K ohm |
| R4 | 10K ohm |
| C1 | 330 nF (nano-Farad) |
| C21 | 17.2 nF (nano-Farad) |
| C22 | 10 nF (nano-Farad) |
| C23 | 15 nF (nano-Farad) |
| C24 | 15 nF (nano-Farad) |

-continued

| Component | Value |
| --- | --- |
| C25 | 15 nF (nano-Farad) |
| C26 | 22 nF (nano-Farad) |
| C27 | 47 nF (nano-Farad) |

By varying the capacitor configuration of the capacitor bank 904 of the circuit 900 dynamically based on the signal strength of an input signal 944, various capacitance values and hence various kinds of output signals 946 with different amplitude adjustment and frequency range filtering could be advantageously produced.

The capacitance value of the capacitor bank 904 is varied based on the input signal 944 in a manner as follow. That is, low capacitance value is set during low input signal level, and high capacitance value is set during high input signal level. The switches SW1 920, SW2 922, SW3 924, SW4 926, SW5 928 and SW6 930 connected in series with the respective capacitors C22 to C27 (908, 910, 912, 914, 916 and 918) are connected/disconnected based on the input signal strength accordingly to increase or decrease the capacitance value of the capacitor bank 904.

With reference to FIG. 8, waveform 814 represents the frequency response of the output signal 946 when the output signal level is −16 dB and the capacitor bank 904 is configured to have the capacitance of C21 only, i.e. 17.2 nF.

Waveform 812 represents the frequency response of the output signal 946 when the output signal level is −13 dB and the capacitor bank 904 is configured to have the capacitance of C21+C22, i.e. 27.2 nF.

Waveform 810 represents the frequency response of the output signal 946 when the output signal level is −10 dB and the capacitor bank 904 is configured to have the capacitance of C21+C22+C23, i.e. 42.2 nF.

Waveform 808 represents the frequency response of the output signal 946 when the output signal level is −8 dB and the capacitor bank 904 is configured to have the capacitance of C21+C22+C23+C24, i.e. 57.2 nF.

Waveform 806 represents the frequency response of the output signal 946 when the output signal level is −6 dB and the capacitor bank 904 is configured to have the capacitance of C21+C22+C23+C24+C25, i.e. 72.2 nF.

Waveform 804 represents the frequency response of the output signal 946 when the output signal level is −4 dB and the capacitor bank 904 is configured to have the capacitance of C21+C22+C23+C24+C25+C26, i.e. 94.2 nF.

Waveform 802 represents the frequency response of the output signal 946 when the output signal level is −2 dB and the capacitor bank 904 is configured to have the capacitance of C21+C22+C23+C24+C25+C26+C27, i.e. 141.2 nF.

It is noted that values inclined toward −2 dB correspond with louder sound and values inclined toward −16 dB correspond with softer sound. Waveform 814 is desired when the entire audible sound input 944 is required to be amplified, such as in cases where the input signal strength is low. Waveform 802 is desired when the low frequency audible sound input 944, comprising the bass sound, is required to be compressed or attenuated, such as in cases where the input signal strength is high.

When the input signal 944 has a low root mean square value, $V_{rms}$, and is below a predetermined threshold level, lesser switches would be closed at the capacitor bank 904 and that translates to lower capacitance at the capacitor bank 904, which results in more compensation on the low frequency components, a trend that can be derived from FIG. 7.

When the input signal 944 has a high root mean square value, $V_{rms}$, and is in between two threshold levels, more switches would be closed at the capacitor bank 904 and that translates to higher capacitance at the capacitor bank 904, which results in lesser compensation on the low frequency components, a trend that can be derived from FIG. 7.

When the input signal 944 has an extremely high root mean square value, $V_{rms}$, and is above a threshold level, all or even more switches would be closed at the capacitor bank 904 and that translates to even higher or maximum capacitance at the capacitor bank 904, which results in compression of low frequency components to prevent clipping from occurring in the sound output 946.

Figure 10:
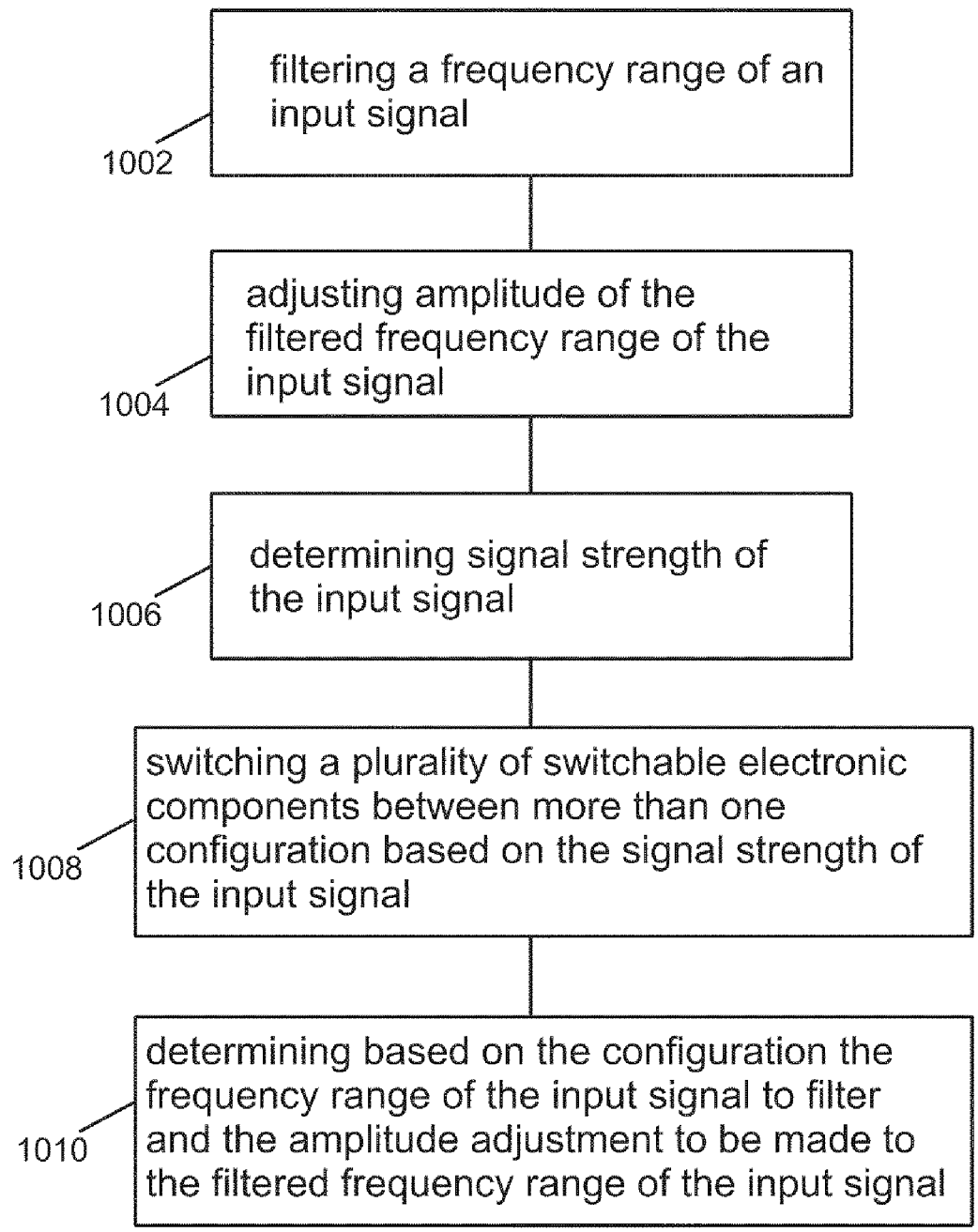
FIG. 10 shows a flowchart illustrating a method according to an example embodiment of the present invention

With reference to FIG. 10, a method for dynamic bass frequency control according to an example embodiment of the present invention is described as follow.

At step 1002, filtering a frequency range of an input signal (e.g. 202 in FIGS. 2 to 5).

At step 1004, adjusting amplitude of the filtered frequency range of the input signal (e.g. 202 in FIGS. 2 to 5).

At step 1006, determining signal strength of the input signal (e.g. 202 in FIGS. 2 to 5).

At step 1008, switching a plurality of switchable electronic components (e.g. 212 in FIG. 2) between more than one configuration based on the signal strength of the input signal (e.g. 202 in FIGS. 2 to 5).

At step 1010, determining based on the capacitor configuration the frequency range of the input signal (e.g. 202 in FIGS. 2 to 5) to filter and the amplitude adjustment to be made to the filtered frequency range of the input signal (e.g. 202 in FIGS. 2 to 5).

It is appreciated that in the example embodiments herein described, the switching resolution may be increased further by adding more switches and capacitors in the capacitor banks (e.g. 302 and 304 in FIG. 3) or by adding more capacitor banks to provide more signal compensation states for seamless audio transition in the audio output of the dynamic low frequency control circuit.

It is appreciated that in another example embodiment, the outputs of the signal level detector 206 described with reference to FIGS. 2, 3 and 4 may be directly connected to the switchable electronic components (212 in FIG. 2), or the first and/or second capacitor banks (302 and 304 in FIG. 3). In this case, the zero signal detector 206 and buffer device 214 are bypassed. While there may be distortion due to jumps because of adjustment transitions at non-zero crossing junctures, the distortion may be bearable (if not negligible) if the switching resolution is very high and responsive (e.g. in terms of hardware processing speed). Also, the distortion would not matter in certain applications not requiring a high degree of signal quality in the output signal (204 in FIGS. 2 and 3).

It is appreciated that in another embodiment, the bandwidth filter 210 described with reference to FIG. 2 may be solely used for filtering frequency range and does not provide signal amplification. In this case, an amplifier (not shown in FIG. 2) which is not part of the bandwidth filter 210 could be connected at the input or output stage of the bandwidth filter 210 to provide the necessary signal level boost or compression. Also, in this case, the switchable electronic components 212 would be coupled to both the amplifier and the bandwidth filter 210 and similar to the example embodiments herein described, changing the capacitance of the switchable electronic components 212 would cause the overall frequency response of the combined circuitry of the amplifier and bandwidth filter 210 to be adjusted.

In the example embodiments herein described, it is appreciated that switching resolution of the plurality of switchable electronic components between different configurations could be progressively increased as the input signal is progressively increased. In other words, that means having progressively more configurations to compensate loudness as the input signal gets louder and progressively lesser configurations to compensate loudness as the input signal gets softer. The reason for doing so is because the human ear is not so sensitive to audio transitions due to loudness compensation at softer input signals. Some modifications to the dynamic low frequency control circuit could be to include circuitry in the signal level detector to compare more threshold voltages of higher amplitudes. Correspondingly, more capacitor configurations could be implemented for loudness compensation when each of the threshold voltages is reached.

Many modifications and other embodiments can be made to the system and its method by those skilled in the art having the understanding of the above described disclosure together with the drawings. Therefore, it is to be understood that the system and its utility is not to be limited to the above description contained herein only, and that possible modifications are to be included in the claims of the disclosure.

The invention claimed is:

1. A system for dynamic bass frequency control, the system comprising:
    a bandwidth filter coupled to a plurality of switchable electronic components for filtering a frequency range of an input signal;
    an amplifier coupled to the bandwidth filter and the plurality of switchable electronic components, the amplifier being configured for adjusting amplitude of the filtered frequency range of the input signal based on a configuration of the plurality of switchable electronic components; and
    a signal level detector coupled to the switchable electronic components for determining signal strength of the input signal,
    the signal level detector being configured to switch the plurality of switchable electronic components between more than one configuration based on the signal strength of the input signal, each configuration determining the frequency range of the input signal to be filtered by the bandwidth filter and the amplitude adjustment to be made to the filtered frequency range of the input signal by the amplifier.

2. The system as claimed in claim 1, the system further comprising:
    a zero crossing detector coupled to the signal level detector for determining zero crossing points in the input signal and generating a zero crossing signal upon determining a zero crossing point, the signal level detector being configured to send a switching signal to switch the switchable electronic components between the more than one configuration based on the zero crossing signal.

3. The system as claimed in claim 2, the system further comprising:
    a buffer device coupled to the zero crossing detector and the signal level detector, the buffer device being configured to store the switching signal and forward the stored switching signal to the switchable electronic components to switch the switchable electronic components between the more than one configuration upon receiving the zero crossing signal from the zero crossing detector.

4. The system as claimed in claim 1, wherein the plurality of switchable electronic components comprises two or more separate capacitor banks, the banks comprising switches for connecting up one or more capacitors to form a configuration.

5. The system as claimed in claim 4, wherein at least one of the capacitor banks has a fixed capacitance value and the capacitance value of at least one of the capacitor banks can be varied.

6. The system as claimed in claim 1, wherein if the signal level detector determines that the input signal strength is above a threshold level, the plurality of switchable electronic components is switched to a configuration that configures the bandwidth filter to filter a bass frequency range of the input signal and configures the amplifier to attenuate the amplitude of the filtered bass frequency range of the input signal.

7. The system as claimed in claim 1, wherein if the signal level detector determines that the input signal strength is below a threshold level, the plurality of switchable electronic components is switched to a configuration that configures the bandwidth filter to filter a bass frequency range of the input signal and configures the amplifier to amplify the amplitude of the filtered bass frequency range of the input signal.

8. The system as claimed in claim 1, wherein switching resolution of the plurality of switchable electronic components between different configurations is progressively increased as the input signal is progressively increased.

9. A method for dynamic bass frequency control, the method comprising:
    filtering a frequency range of an input signal;
    adjusting amplitude of the filtered frequency range of the input signal;
    determining signal strength of the input signal;
    switching a plurality of switchable electronic components between more than one configuration based on the signal strength of the input signal; and
    determining based on the configuration the frequency range of the input signal to filter and the amplitude adjustment to be made to the filtered frequency range of the input signal.

10. The method as claimed in claim 9, the method further comprising:
    determining a zero crossing point in the input signal;
    generating a zero crossing signal upon determining a zero crossing point; and
    switching the plurality of switchable electronic components between the more than one configuration based on the zero crossing signal.

11. The method as claimed in claim 10, the method further comprising:
    storing a switching signal to switch the switchable electronic components between the more than one configuration; and
    forwarding the stored switching signal to switch the switchable electronic components between the more than one configuration on receiving the zero crossing signal.

12. The method as claimed in claim 9, the method comprising:
    switching the plurality of switchable electronic components to a configuration that causes the filtering of a bass frequency range of the input signal and attenuation of the amplitude of the filtered bass frequency range of the input signal if the input signal strength is determined to be above a threshold level.

13. The method as claimed in claim 9, the method comprising:
    switching the plurality of switchable electronic components to a configuration that causes the filtering of a bass frequency range of the input signal and amplification of the amplitude of the filtered bass frequency range of the input signal if the input signal strength is determined to be below a threshold level.

\* \* \* \* \*